United States Patent
Nakano et al.

(10) Patent No.: US 8,335,125 B2
(45) Date of Patent: Dec. 18, 2012

(54) SEMICONDUCTOR MEMORY DEVICE WITH A STACKED GATE INCLUDING A CHARGE STORAGE LAYER AND A CONTROL GATE AND METHOD OF CONTROLLING THE SAME

(75) Inventors: Takeshi Nakano, Kawasaki (JP); Hiroshi Nakamura, Fujisawa (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/285,099

(22) Filed: Oct. 31, 2011

(65) Prior Publication Data

US 2012/0044766 A1    Feb. 23, 2012

Related U.S. Application Data

(62) Division of application No. 12/406,382, filed on Mar. 18, 2009, now Pat. No. 8,077,523.

(30) Foreign Application Priority Data

Apr. 28, 2008    (JP) .................................. 2008-117784

(51) Int. Cl.
*G11C 8/00*    (2006.01)
(52) U.S. Cl. ......... 365/230.06; 365/185.18; 365/185.23; 365/185.26; 365/189.09

(58) Field of Classification Search ............. 365/230.06, 365/185.18, 185.23, 185.26, 189.09
See application file for complete search history.

(56) References Cited

U.S. PATENT DOCUMENTS

| | | |
|---|---|---|
| 7,085,162 B2 | 8/2006 | Nakamura et al. |
| 7,274,603 B2 | 9/2007 | Futatsuyama et al. |
| 7,286,402 B2 | 10/2007 | Nakamura et al. |

FOREIGN PATENT DOCUMENTS

JP    2002-63795    2/2002

OTHER PUBLICATIONS

Japanese Office Action for application No. 2008-117784, mailed Aug. 7, 2012 (with English translation).

*Primary Examiner* — Kretelia Graham
(74) *Attorney, Agent, or Firm* — Oblon, Spivak, McClelland, Maier & Neustadt, L.L.P.

(57) ABSTRACT

A semiconductor memory device includes a transfer circuit and a control circuit. The transfer circuit which includes a p-type MOS transistor with a source to which is applied a first voltage and an n-type MOS transistor to whose gate the drain of the p-type MOS transistor is connected and the first voltage is transferred, to whose source a second voltage is applied, and whose drain is connected to a load. The control circuit which turns the p-type MOS transistor on and off and which turns the p-type MOS transistor on to make the p-type MOS transistor transfer the second voltage to the load and, during the transfer, turns the p-type MOS transistor off to make the gate of the n-type MOS transistor float at the first voltage.

5 Claims, 8 Drawing Sheets

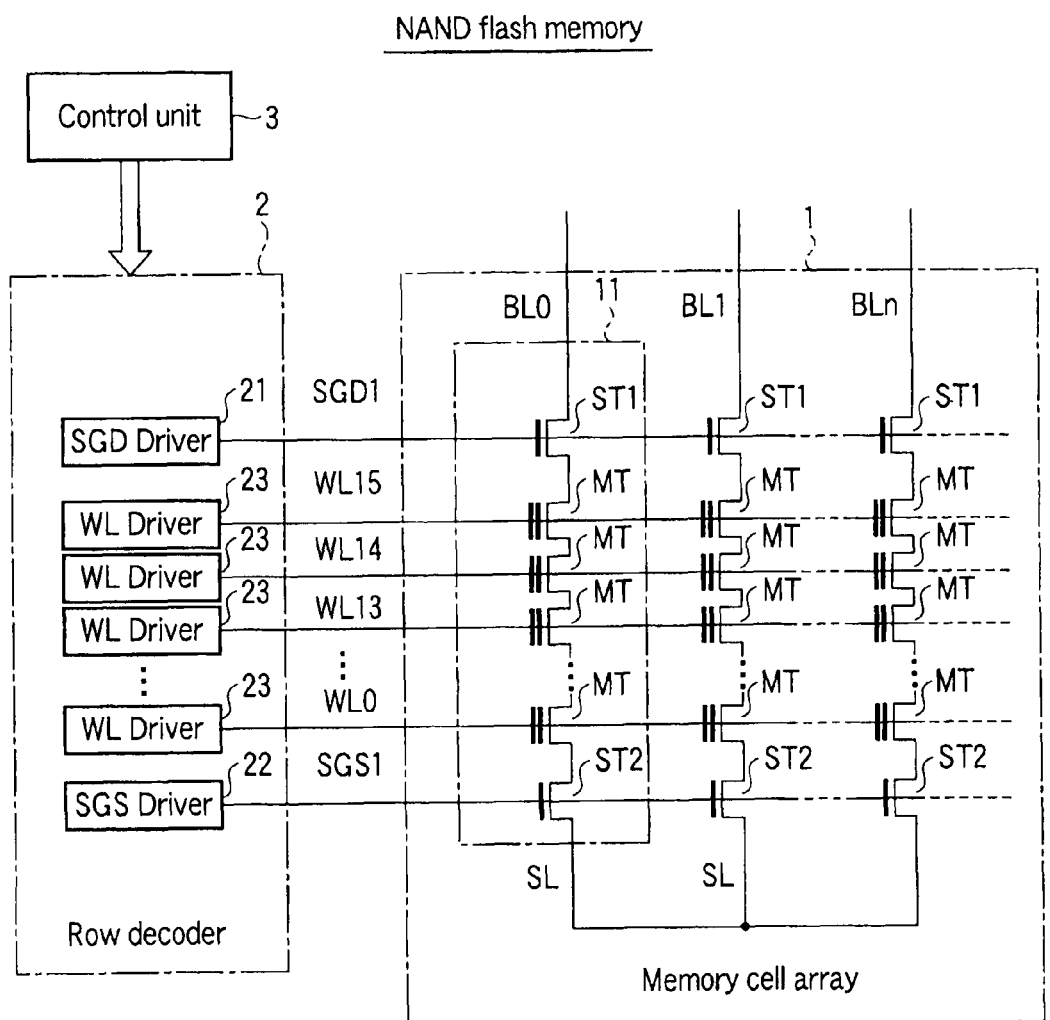
F I G. 1

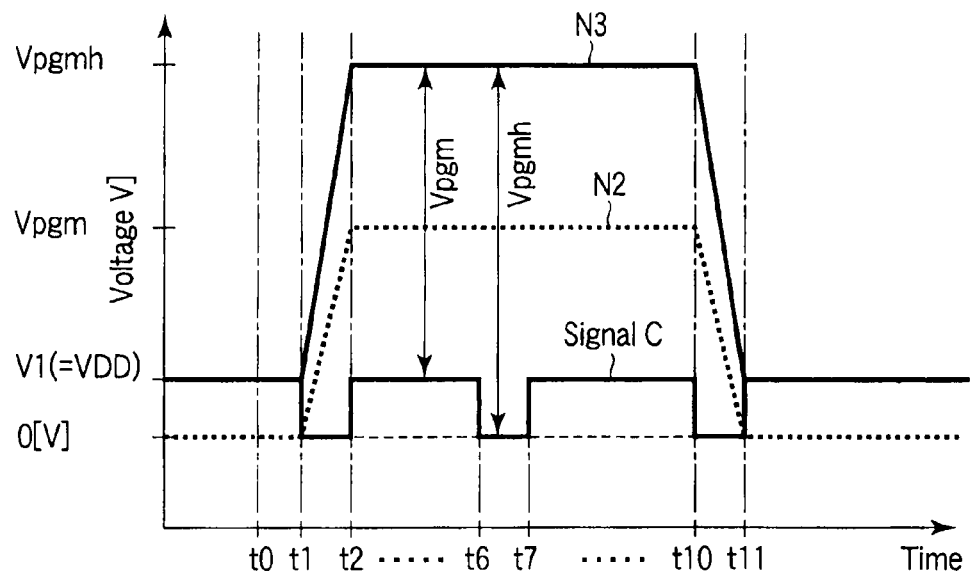
F I G. 7
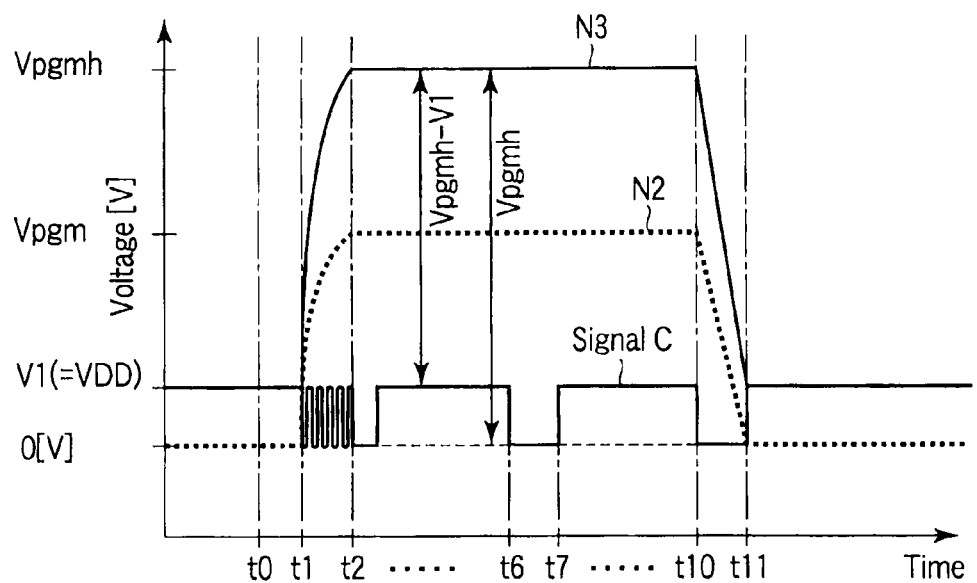
F I G. 8

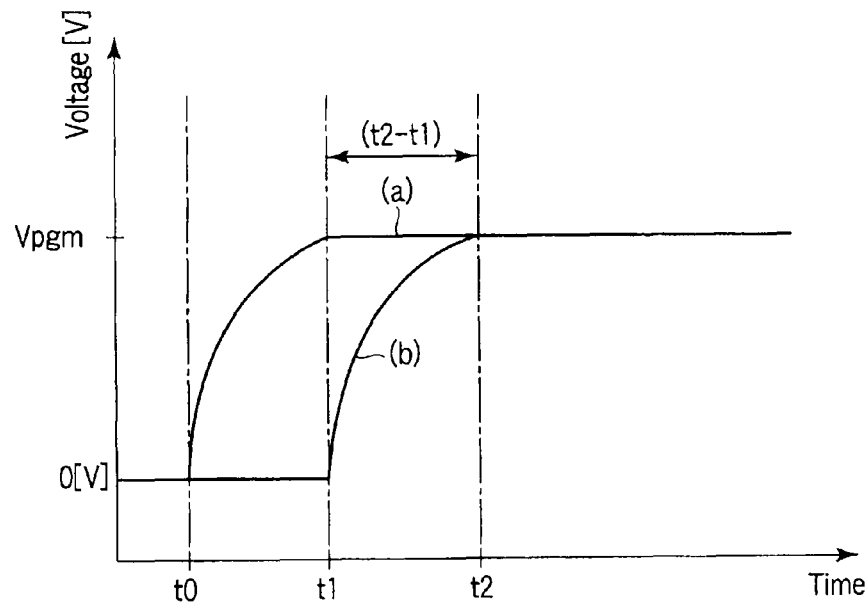
F I G. 11
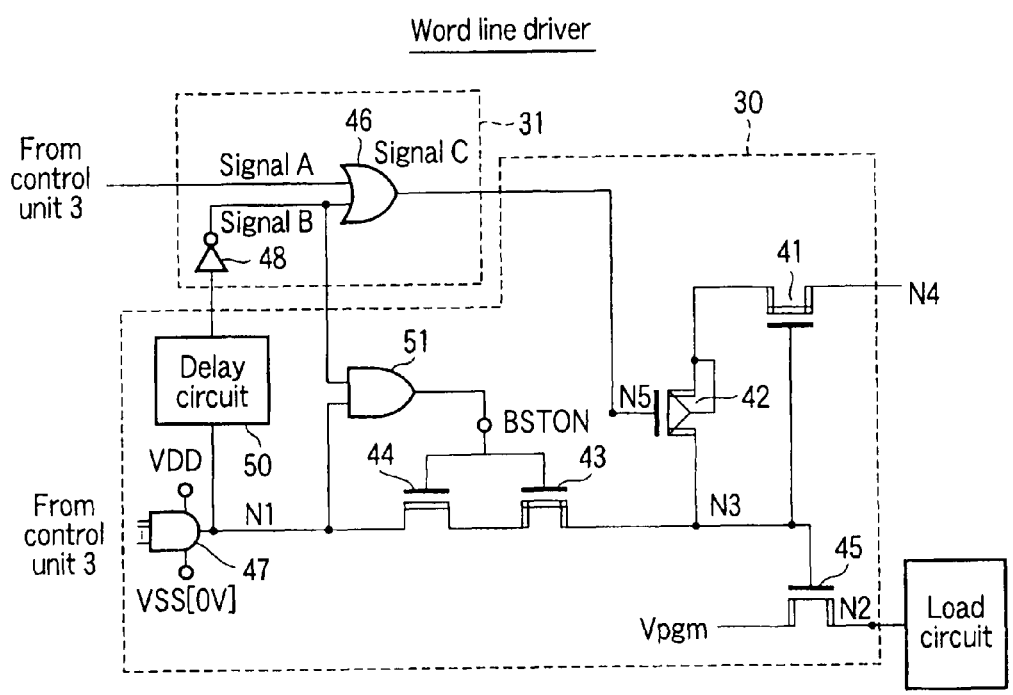
F I G. 12

SEMICONDUCTOR MEMORY DEVICE WITH A STACKED GATE INCLUDING A CHARGE STORAGE LAYER AND A CONTROL GATE AND METHOD OF CONTROLLING THE SAME

CROSS-REFERENCE TO RELATED APPLICATION

This application is a division of and claims the benefit of priority under 35 U.S.C. §120 from U.S. Ser. No. 12/406,382, filed Mar. 18, 2009 and claims the benefit of priority from prior Japanese Patent Application No. 2008-117784, filed Apr. 28, 2008, the entire contents of which are incorporated herein by reference.

BACKGROUND OF THE INVENTION

1. Field of the Invention

This invention relates to a semiconductor memory device and a method of controlling the semiconductor memory device, and more particularly to a word-line driver.

2. Description of the Related Art

A NAND flash memory includes a plurality of nonvolatile memory cells. Each memory cell is, for example, an n-type MOS transistor with a stacked gate including, for example, a charge storage layer and a control gate. To write data to, or read or erase it from, a memory cell, a specific must be applied to the control gate of the memory cell functioning as a word line. Writing data particularly needs a high voltage, such as voltage Vpgm. The voltage Vpgm is transferred by the row decoder to the selected word line. The voltage Vpgm is a high voltage necessary to inject electrons into the charge storage layer by FN Tunneling.

The row decoder includes an n-type MOS transistor which transfers the voltage Vpgm to a word line. The row decoder further includes a p-type MOS transistor which functions as a switch for transferring a voltage Vpgmh higher than the voltage Vpgm to the gate of the n-type MOS transistor. The row decoder turns the p-type MOS transistor on or off as needed. When the p-type MOS transistor is on, the voltage Vpgmh transferred by the p-type MOS transistor is applied to the gate of the n-type transistor, enabling the n-type transistor to transfer the voltage Vpgm to a word line. This is disclosed in, for example, Jpn. Pat. Appln. KOKAI Publication No. 2002-63795. In this case, since zero potential is applied to the gate of the p-type MOS transistor, a high stress due to Vpgmh is applied between the gate and channel of the p-type MOS transistor, that is, to the gate insulating film. Accordingly, continuing to apply zero potential to the gate of the p-type MOS transistor for a long time has been known to cause deterioration of the p-type MOS transistor, making the row decoder circuit as a whole unstable.

To make the p-type MOS transistor less likely to deteriorate, measures can be taken such as reducing the maximum voltage applied to the gate of the p-type MOS transistor, changing the design rules of the MOS transistor, or using multiple p-type MOS transistors in parallel.

However, even with the above measures in place, progress in multilevel NAND flash memories entails increasing Vpgm and Vpgmh. Specifically, since the voltage Vpgmh applied to the gate of the p-type MOS transistor is high, using multiple p-type MOS transistors in parallel to reduce the load on individual transistors through time division is approaching its limit. Furthermore, the parallel arrangement makes the circuit very large; that is, the change in transistor design rules has also reached its limit.

BRIEF SUMMARY OF THE INVENTION

A semiconductor memory device according to an aspect of the present invention includes:

a transfer circuit which includes a p-type MOS transistor with a source to which is applied a first voltage and an n-type MOS transistor to whose gate the drain of the p-type MOS transistor is connected and the first voltage is transferred, to whose source a second voltage is applied, and whose drain is connected to a load; and a control circuit which turns the p-type MOS transistor on and off and which turns the p-type MOS transistor on to make the p-type MOS transistor transfer the second voltage to the load and, during the transfer, turns the p-type MOS transistor off to make the gate of the n-type MOS transistor float at the first voltage.

A semiconductor memory device controlling method according to an aspect of the present invention includes:

a transfer circuit which includes a p-type MOS transistor with a source to which is applied a first voltage and an n-type MOS transistor to whose gate the drain of the p-type MOS transistor is connected and the first voltage is transferred, to whose source a second voltage is applied, and whose drain is connected to a load, and a control circuit which turns the p-type MOS transistor on and off, the method comprising:

making the control circuit turn the p-type MOS transistor on to make the p-type MOS transistor transfer the first voltage to the gate of the n-type MOS transistor, thereby turning the n-type MOS transistor on;

turning the n-type MOS transistor on to transfer the second voltage to the load;

turning the p-type MOS transistor off in the middle of transferring the second voltage to the load, thereby making the gate of the n-type MOS transistor float at the first voltage; and making the floating n-type MOS transistor transfer the second voltage to the load.

BRIEF DESCRIPTION OF THE SEVERAL VIEWS OF THE DRAWING

FIG. 1 is a block diagram of a semiconductor memory device according to a first embodiment of the invention;

FIG. 7 is a timing chart of potential changes at nodes N2 and N3, and in signal C, illustrating the voltage transfer operation by a word-line driver according to a second embodiment of the invention;

FIGS. 8 and 9 are timing charts of potential changes at nodes N2 and N3, and in signal C, illustrating the operation of a word-line driver according to a third embodiment of the invention;

FIG. 11 is a timing chart showing potential changes at the control gate of a memory cell of the third embodiment;

FIG. 12 is a circuit diagram of a word-line driver according to a modification of the first embodiment.

DETAILED DESCRIPTION OF THE INVENTION

Figure 2:
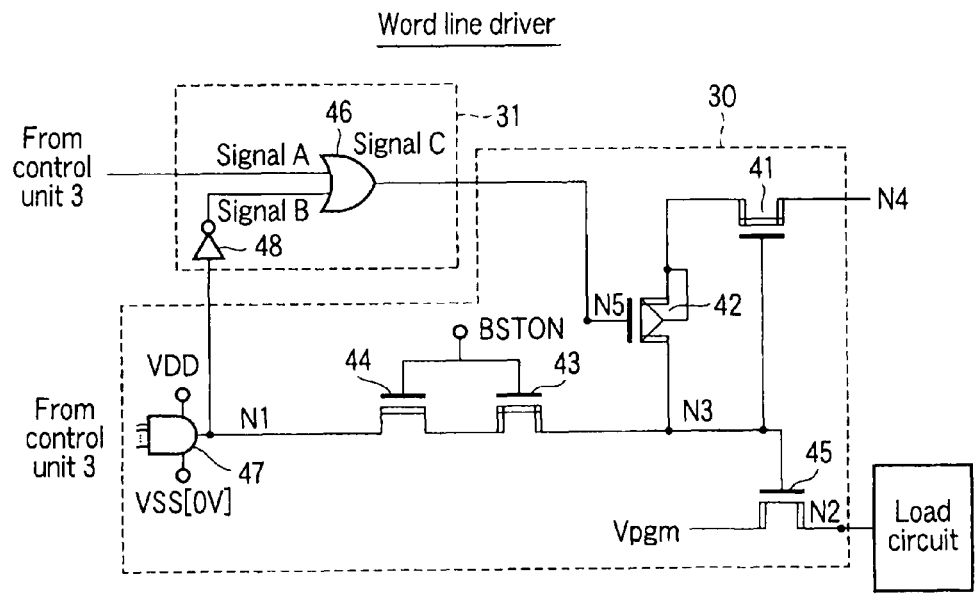
FIG. 2 is a circuit diagram of a word-line driver according to the first embodiment.

Hereinafter, referring to the accompanying drawings, embodiments of the invention will be explained. The same parts are indicated by the same reference numbers throughout the drawings.

First Embodiment

A semiconductor memory device according to a first embodiment of the invention and a method of controlling the semiconductor memory device will be explained. Hereinafter, the semiconductor memory device will be explained, taking a NAND flash memory as an example.

<Overall Configuration of NAND Flash Memory>

First, an overall configuration of the semiconductor memory device will be explained with reference to FIG. 1. FIG. 1 is a block diagram of a NAND flash memory according to the first embodiment.

As shown in FIG. 1, the NAND flash memory comprises a memory cell array 1, a row decoder 2, and a control unit 3.

The memory cell array 1 includes a plurality of nonvolatile memory cells each capable of holding data. Each of the memory cells is an n-channel MOS transistor which has a stacked gate including, for example, a charge storage layer and a control gate. The control gate of a memory cell functions as a word line. The drain of the memory cell is connected electrically to a bit line. The source of the memory cell is connected electrically to a source line.

When data is written, read, or erased, the row decoder 2 selects a row direction in the memory cell array 1 on the basis of a row address supplied from the control unit 3. That is, on the basis of the row address supplied from the control unit 3, the row decoder 2 applies a voltage to select gate lines SGD1 and SGS1 and word lines WL0 to WL15.

The control unit 3 controls the operation of the entire NAND flash memory. Specifically, on the basis of a control signal supplied from a host (not shown), the control unit 3 carries out an operation sequence in writing, reading, or erasing data. Here, the control signal includes, for example, a command and a row address. The control unit outputs these to the row decoder 2. The control unit 3 further includes a voltage generator circuit. The voltage generator circuit generates voltages necessary for a write operation, a read operation, or an erase operation and supplies the voltages to, for example, the row decoder 2 in the NAND flash memory.

<Configuration of Memory Cell Array 1>

The configuration of the memory cell array 1 will be explained in detail with reference to FIG. 1.

The memory cell array 1 includes a plurality of NAND cells 11 each of which has nonvolatile memory cells capable of holding data connected in series. Each of the NAND cells 11 includes, for example, 16 memory cell transistors MT and select transistors ST1, ST2. Each of the memory cell transistors MT is an n-channel MOS transistor with, for example, a MONOS or an FG stacked gate. The MONOS stacked gate has the following configuration: the stacked gate includes a charge storage layer (insulating film) formed via a gate insulating film above a p-type semiconductor substrate, an insulating film (hereinafter, referred to as a block layer) which is formed on the charge storage layer and whose permittivity is higher than that of the charge storage layer, and a control gate formed on the block layer. The FG stacked gate includes a charge storage layer (floating gate: conducting layer) formed via a gate insulating film above a semiconductor substrate and a control gate formed via an inter-gate insulating film above the floating gate. The number of memory cell transistors MT is not limited to 16 and may be 8, 32, 64, 128, 256, and more. The number of memory cell transistors MT is nonlimiting. The adjacent memory cell transistors MT share a source and a drain. They are arranged between the select transistors ST1 and ST2 in such a manner that their current paths are connected in series. The drain region on one end side of the memory cell transistors MTs connected in series is connected to the source region of the select transistor ST1 and the source region the other end side is connected to the drain region of the select transistor ST2.

The control gate electrodes of the memory cell transistors MT in the same row are connected to any one of word line WL0 to word line WL15 in a common connection manner. The gate electrodes of the select transistors ST1 of the memory cells in the same row are connected to a select gate line SGD1 in a common connection manner. The gate electrodes of the select transistors ST2 of the memory cells in the same row are connected to a select gate line SGS1 in a common connection manner. To simplify explanation, when there is no need to distinguish between word lines WL0 to WL15, they will simply be referred to as the word lines WL. In the memory cell array 1, the drains of the select transistors ST1 in the same column are connected to any one of bit lines BL0 to BLn (n is a natural number) in a common connection manner. Hereinafter, when there is no need to distinguish between bit lines BL0 to BLn, they will simply be referred to as the bit lines BL. The sources of the select transistors ST2 are connected to a source line SL in a common connection manner. Both of the select transistors ST1 and ST2 are not necessarily needed. Only either the select transistors ST1 or ST2 may be used, provided that the NAND cells 11 can be selected.

In FIG. 1, only one row of NAND cells 11 is shown. In the memory cell array 1, a plurality of rows of NAND cells 11 may be provided. In this case, the NAND cells 11 in the same column are connected to the same bit line BL. Data is written into a plurality of memory cell transistors MT connected to the same word line WL at the same time. This writing unit is called a page. Data is erased from a plurality of NAND cells 11 in the same row at the same time. This erasing unit is called a memory block.

<Configuration of Row Decoder 2>

Next, a configuration of the row decoder 2 will be explained. As shown in FIG. 1, the row decoder 2 includes select gate line drivers 21 and 22 provided for the select gate lines SGD1 and SGS1, respectively, and word line drivers 23 provided for word lines WL in a one-to-one correspondence.

According to the result of decoding a page address, the select gate line driver 21 transfers a necessary voltage to the gate of the select transistor ST1 via the select gate line SGD1. That is, when data is written, read, erased, or verified in the memory cell transistor MT, the select gate line driver 21 transfers a necessary voltage to the gate of the select transistor ST1 via the select gate line SGD1.

When data is written, read, or verified in the memory cell transistor MT, the select gate line driver 22 transfers a necessary voltage to the gate of the select transistor ST2 via the select gate line SGS1. Moreover, when data is erased, the select gate line driver 22 transfers zero potential to the gate of the select transistor ST2 via the select gate line SGS1.

Next, the word line driver 23 will be explained. According to the result of decoding the page address, the word line driver 23 transfers a necessary voltage to the control gate of the memory cell transistor MT via the word line WL.

Referring to FIG. 2, the configuration of the word line driver 23 will be explained in detail. FIG. 2 is a circuit diagram of the word line driver 23. As shown in FIG. 2, the word line driver 23 includes a control circuit 31 and a transfer circuit 30.

First, the control circuit 31 will be explained in detail. As shown in FIG. 2, the control circuit 31 includes an OR gate 46 and an inverter 48. The inverter 48 inverts a decode signal supplied from the transfer circuit 30. Then, the inverter 48 outputs the inverted signal as signal B. Signals A and B are supplied to the OR gate 46. The OR gate 46 produces the logical sum of signals A and B, outputting the result as signal C. If the result of the OR operation is high, the potential of C is set at V1 (greater than zero). If the result is low, the potential of C is set at zero.

Next, the transfer circuit 30 will be explained in detail. As shown in FIG. 2, the transfer circuit 30 includes n-type MOS transistors 41, 43, 44, 45, a p-type MOS transistor 42, and an AND gate 47. The AND gate 47 ANDs the bits in the block address supplied from the control unit 3. That is, the AND gate 47 decodes the block address. Then, depending on the result of decoding, the AND gate 47 outputs high (i.e., voltage VDD) or low (i.e., zero potential) as the decode signal to node N1. Then, the decode signal output from the AND gate 47 is input to the inverter 48 of the control circuit 31.

The MOS transistor 44 is a low-withstand-voltage depletion-mode n-channel MOS transistor. Node N1 is connected to the source of the MOS transistor 44. The drain of the MOS transistor 43 is connected to the drain of the MOS transistor 44. Signal BSTON is supplied to the gate of the MOS transistor 44. BSTON is at either the voltage VDD or zero potential.

The MOS Transistor 43 is a higher-withstand-voltage depletion-mode n-channel MOS transistor than the MOS transistor 44. Therefore, the threshold potential of transistor 43 is less than or equal to zero. The drain of transistor 44 is connected to the source of transistor 43. The drain of the MOS transistor 42 is connected to the drain of the MOS transistor 43. Signal BSTON is supplied to the gate of the MOS transistor 43. Hereinafter, the junction of the drains of the MOS transistors 42 and 43 is referred to as node N3.

The MOS transistor 42 is a high-withstand-voltage enhancement-mode p-channel MOS transistor. The drain of the MOS transistor 41 is connected to the source of the MOS transistor 42. The drain of the MOS transistor 43 is connected to the drain of the MOS transistor 42. Node N5 is connected to the gate of the MOS transistor 42. Signal C output from the control circuit 31 is supplied to node N5. If C is at zero, the transistor turns on.

The MOS transistor 41 is a high-withstand-voltage depletion-mode n-channel MOS transistor. Node N4 is connected to the source of the MOS transistor 41. The source of the MOS transistor 42 is connected to the drain of the MOS transistor 41. The gate of the MOS transistor 41 is connected to the drain of the MOS transistor 43 and to node N3. Either voltage Vpgmh or voltage VDD is applied to node N4.

The MOS transistor 45 is a high-withstand-voltage enhancement-mode n-channel MOS transistor. Voltage Vpgm is applied to the source of the MOS transistor 45. Node N2 is connected to the drain of the MOS transistor 45. The drain of the MOS transistor 42, node N3, and the gate of the MOS transistor 41 are connected to the gate of the MOS transistor 45. A word line WL is connected to node N2 (in FIG. 2, referred to as a load circuit).

Here, voltage Vpgmh and voltage Vpgm satisfy the relationship Vpgmh>Vpgm. The potential difference between voltage Vpgmh and Vpgm is greater than the threshold voltage of the MOS transistor 45. More preferably, voltage Vpgmh is greater than the sum of the threshold voltages of the MOS transistors 41, 42, and 45.

Figure 3:
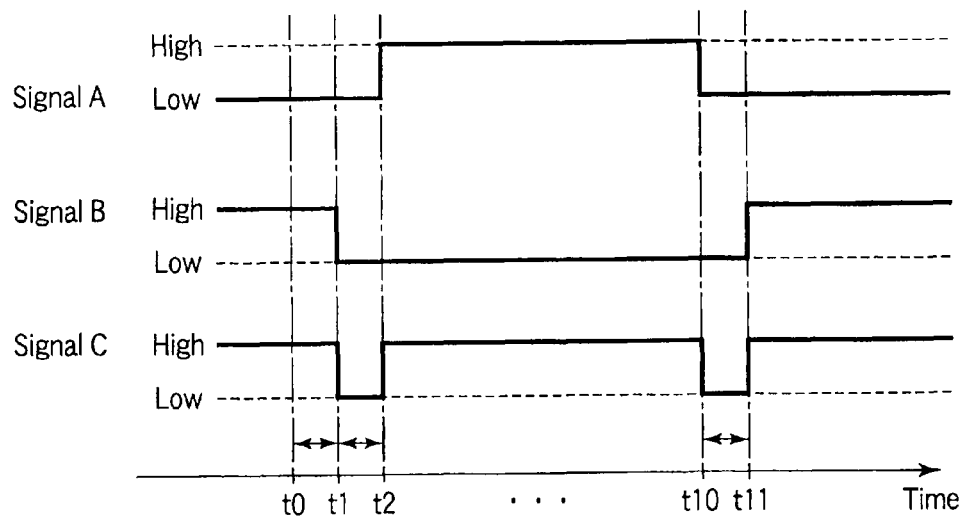
FIG. 3 is a timing chart of signals A to C in the first embodiment.

Next, signals A, B, and C when the control circuit 31 transfers voltage Vpgm to the word line WL will be explained with reference to FIG. 3. FIG. 3 is a timing chart of signals A, B, and C. The timing with which A and B are supplied is controlled by the control unit 3.

As shown in FIG. 3, at time t0 before voltage transfer, the control unit 3 makes A low and the AND gate 47 makes the decode signal low. Then, the inverter 48 inverts the signal, making B high. Therefore, the OR gate 46 makes C high.

Then, to start transfer of voltage Vpgm at time t1, a block address is input to the AND gate 47. The AND gate 47 then makes the decode signal high. As a result, B goes low. Accordingly, the OR gate 46 makes C low.

Then, at time t2 during the voltage transfer, the control unit 3 makes A high. The output of AND gate 47 stays low. This inverts C so it goes high. During the time between times t2 to t10, the control unit 3 makes A high and the AND gate 47 output goes low. Accordingly, C stays high.

Then, at time t10, the control unit 3 makes A low to end the transfer of voltage Vpgm. This inverts C so it goes low.

Thereafter, at time t11, the control unit 3 makes A low and the AND gate 47 output goes low. This inverts C so it goes high.

<Operation of Word Line Driver 23>

Figure 4:
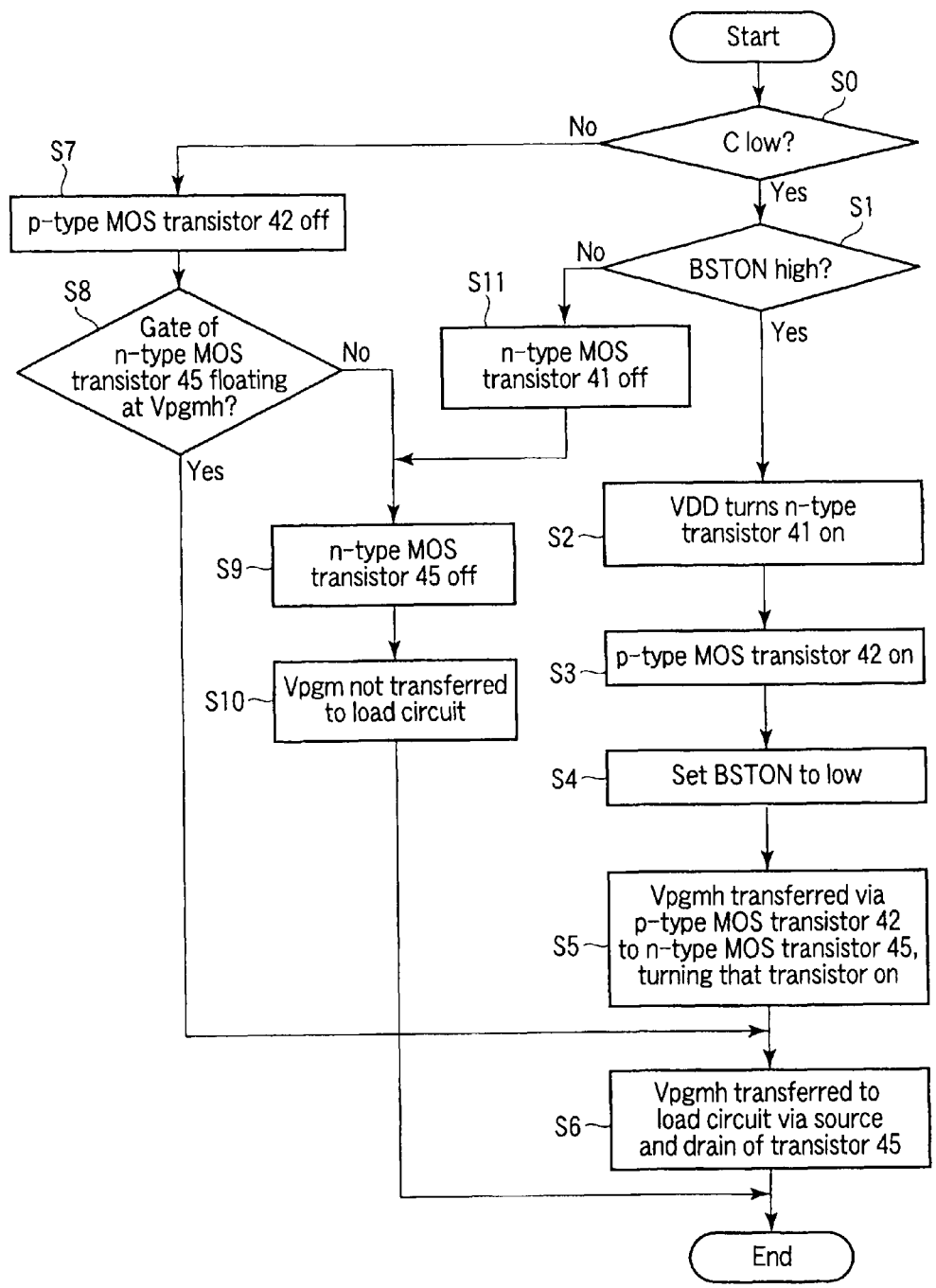
FIG. 4 is a flowchart for a word-line driver according to the first embodiment.

Next, the overall operation of the word line driver 23 including the control circuit 31 and transfer circuit 30 will be explained with reference to FIG. 4. FIG. 4 is a flowchart to explain the flow of operation of the word line driver 23. At the beginning of a write operation, the AND gate 47 makes the decode signal high. When signal C output from the OR gate 46 is low (YES in step S0), if the output of signal BSTON is high (YES in step S1), a high decode signal is applied to the gate of the MOS transistor 41. This turns the MOS transistor 41 on (step S2). Since C is low in step S0 (YES in step S0), zero potential is applied to the gate of transistor 42. This turns transistor 42 on (step S3). Thereafter, BSTON is made low (step S4). This makes the high decode signal make node N3 float. Thereafter, potential difference Vpgmh is applied between the gate and channel of the MOS transistor 42. Then, the MOS transistor 42 transfers voltage Vpgmh applied to the source (node N4) of the MOS transistor 41 to the gate of the MOS transistor 45. As a result, the potential difference between voltage Vpgm at the source of the MOS transistor 45 and voltage Vpgmh applied to the gate of the MOS transistor 45 turns the MOS transistor 45 on (step S5). This makes the MOS transistor 45 transfer voltage Vpgm to the load circuit (step S6).

If in step S0, C output from the OR gate 46 is high (NO in step S0), since the potential difference between the gate and channel of transistor 42 is small, this turns the MOS transistor 42 off (step S7). Here, if voltage Vpgmh has been applied to the gate of the MOS transistor 45, that is, if the gate of the MOS transistor 45 is floating (YES in step S8), the MOS transistor 45 carries out the operation in step S6. Moreover, if in step S8, the gate of the MOS transistor 45 is at voltage VDD or zero potential (NO in step S8), the MOS transistor 45 is off (step S9), preventing voltage Vpgm from being transferred to the word line WL (step S10). Moreover, if in step S1, if the output of BSTON is low (NO in step S1), transistor 41 is off (step S11), causing the operations in steps S9 and S10 to be carried out.

Figure 5:
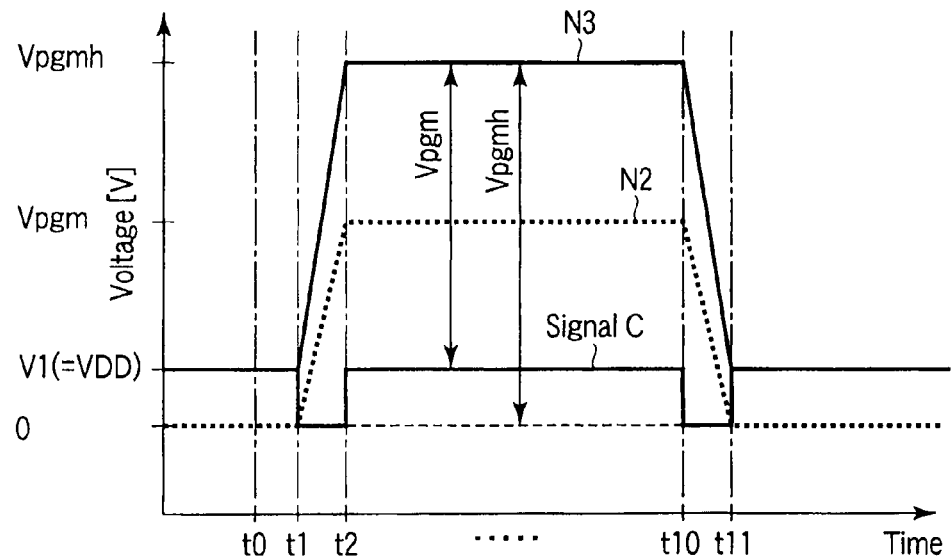
FIG. 5 is a timing chart of potential changes at nodes N2 and N3, and in signal C, illustrating the voltage transfer operation by the word-line driver of the first embodiment.

Next, the voltage transfer operation performed by the word line driver 23 configured as described above will be explained with reference to FIG. 5. FIG. 5 is a timing chart to help explain potential changes at nodes N2 and N3 and in signal C, with the ordinate representing voltage and the abscissa representing time.

In the first embodiment, suppose the potential at the gate of the MOS transistor 45, that is, node N3, before potential transfer and after the completion of the transfer is at voltage VDD. Moreover, voltage VDD and voltage V1 are equal (the same holds true in second to fifth embodiments of the invention).

The transfer of voltage Vpgm is started at time t1. That is, C is made low, causing zero potential to be applied to the gate of the MOS transistor 42 (YES in step S0). At this time, if BSTON is high, that is, at VDD, a high signal, that is, voltage V1, is applied to the gate of the MOS transistor 41. The reason is that, when C output from the control circuit 31 is low, high is output at node N1, that is, the AND gate 47 outputs voltage VDD as a decode signal. Accordingly, the MOS transistor 41 is on (step S2). This causes voltage Vpgmh transferred from the source (node N4) of the MOS transistor 41 to be applied to the gate of the MOS transistor 42. Then, the MOS transistor 42 turns on (step S3). Thereafter, BSTON is made low (step S4) and then voltage Vpgmh is transferred to the gate of the MOS transistor 45 via node N3. That is, the potential at node N3 rises to voltage Vpgmh. This turns the MOS transistor 45 on (step S5), causing voltage Vpgm to be transferred to the word line WL (step S6). That is, the potential at node N2 rises to voltage Vpgm.

Next, during the period between times t2 and t10, the control circuit 31 makes signal C high. That is, since voltage V1 is applied to the gate of transistor 42 (NO in step S0), the MOS transistor 42 turns off (step S7). This makes the gate of the MOS transistor 45 float at voltage Vpgmh (YES in step S8), which makes transistor 45 stay on and continue transferring voltage Vpgm to the word line WL.

At time t10, the control unit 3 switches not only the potential at node N4 from voltage Vpgmh to voltage VDD but also signal C from voltage V1 to zero potential, thereby turning the MOS transistor 42 on (YES in step S0), which makes voltage Vpgmh at node N3 drop to voltage VDD. Consequently, the MOS transistor 45 is turned off (step S9). Accordingly, the MOS transistor 45 stops the transfer of voltage Vpgm to the load circuit (step S10). At this time, BSTON is low (step S11). As a result, at time t10, the potentials at nodes N3 and N2 drop. Then, at time t11, node N2 is at zero potential and node N3 is at voltage VDD. Therefore, the MOS transistor 45 turns off (step S9). This completes the transfer of voltage Vpgm to the load circuit (step S10).

At time t11, the control circuit applies voltage V1 to the gate of the MOS transistor 42, which turns transistor 42 off. As a result, even if the MOS transistor 42 is on, Vpgm is transferred to the gate of the MOS transistor 45, preventing voltage Vpgm from being transferred to the load circuit.

After the completion of the write operation, the source of the MOS transistor 45 is grounded, which puts the load circuit, that is, the word line WL, at zero potential. Moreover, the output of the AND gate 47 is made low, causing node N3 to be at zero potential. This turns transistor 45 off.

<Effect of First Embodiment>

As described above, according to the semiconductor memory device of the first embodiment and the method of controlling the semiconductor memory device, the effect described in item 1, below, will be obtained.

(1) Improvement of Operational Reliability (Part 1)

With the configuration of the first embodiment, the stress on the MOS transistor 42 in the word line driver 23 is reduced in the middle of transferring Vpgm to the word line WL, which enables the operational reliability of the NAND flash memory to be improved. This effect will be explained below.

Figure 6:
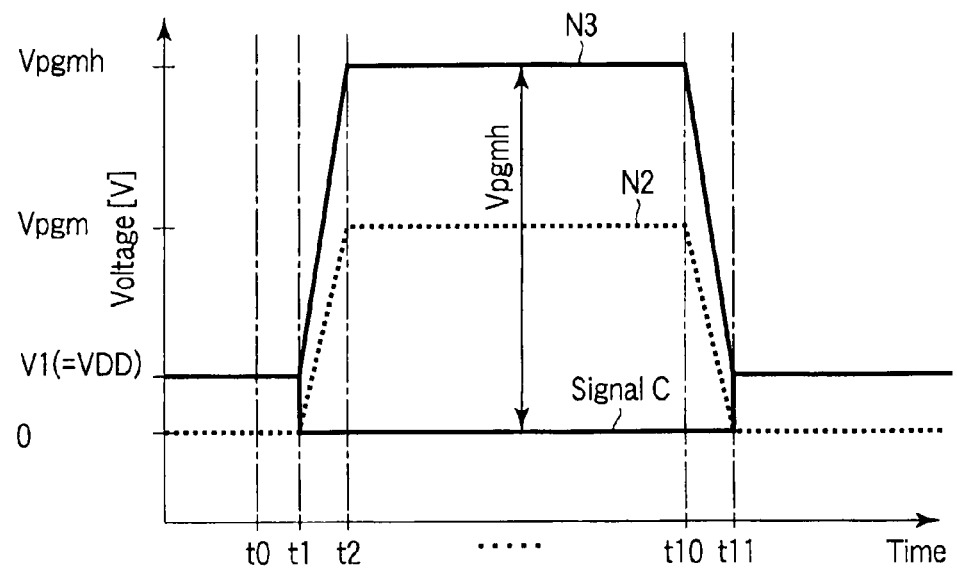
FIG. 6 is a timing chart of potential changes at nodes N2 and N3, and in signal C, illustrating the potential transfer operation by the word-line driver of a comparative example of the first embodiment.

To transfer voltage Vpgm to the word line, it is necessary to turn on the MOS transistor 45. To do this, it is common practice to turn on the MOS transistor 42 which functions as a switch for transferring voltage Vpgmh to the gate of the MOS transistor 45. FIG. 6 shows potential changes in signal C and at nodes N2 and N3 at this time.

As shown in FIG. 6, during the time between transfer start time t1 and transfer end time t11 of voltage Vpgm, C is always kept at zero potential. This turns the MOS transistor 42 on, causing voltage Vpgmh to be applied to the gate of the MOS transistor 45.

In this example, during the time between times t2 and t10, there is always a potential difference of Vpgmh between the gate and channel of the MOS transistor 42, that is, at the gate oxide film of the MOS transistor 42. The potential difference Vpgmh is one of the highest potential differences in the NAND flash memory. With more and more recent NAND flash memories being configured to have multiple levels to meet the need for reduced circuit size and larger capacity, voltage Vpgmh is accordingly required to be higher. Therefore, applying potential difference Vpgmh to the gate insulating film for a long time places great stress on the MOS transistor 42, contributing to the deterioration of the operational stability of the row decoder 2. In some cases, the MOS transistor 42 might be destroyed.

With the configuration of the first embodiment, the row decoder 2 includes the control circuit 31. The control circuit 31 keeps C high (VDD greater than zero) during the time (between times t2 and t10 in FIG. 5) excluding the transfer start and end times of voltage Vpgm). That is, the duty ratio of C in transferring voltage Vpgm is made smaller. The duty ratio is the ratio of the period during which C is made active (low) to the transfer period. In the example of FIG. 5, it is expressed by ((t1 to t2)+(t10 to t11))/(t1 to t11). Accordingly, the potential difference between the gate and channel of the MOS transistor 42 in the period between times t2 and t10 is (Vpgmh−VDD), which is smaller than that in the above case. As a result, the stress on the MOS transistor 42 can be reduced, enabling the operational stability of the row decoder to be improved.

Even if signal is made high in the period between times t2 and t10, voltage Vpgm will be transferred without problem. The reason is that, at time t2, the potential at the gate (node N3) of the MOS transistor 45 has already reached voltage Vpgmh. That is, even if, at time t2, the signal is made high to turn the MOS transistor 42 off, the gate of the MOS transistor 45 is floating at voltage Vpgmh, so that the MOS transistor 45 stays on.

Second Embodiment

Next, a semiconductor memory device according to a second embodiment of the invention and a method of controlling the semiconductor memory device will be explained. In the second embodiment, the semiconductor memory device will be explained, taking a NAND flash memory as an example as in the first embodiment. The second embodiment is such that, in FIG. 2, after the MOS transistor 42 is switched from the on state to the off state to make the gate of the MOS transistor 45 float temporarily, the control circuit 31 turns the MOS transistor 42 on at least once in the middle of transferring voltage Vpgm to the word line WL. Hereinafter, only what differs from the first embodiment will be explained.

Since the control circuit 31 and transfer circuit 30 in the word line driver 23 have the same configuration as that of the first embodiment, explanation of them will be omitted.

The voltage transfer operation performed by the word line driver 23 of the second embodiment will be explained with reference to FIG. 7. FIG. 7 is a timing chart to help explain potential changes at nodes N2 and N3 and in signal C, with the ordinate representing voltage and the abscissa representing time. As shown in FIG. 7, the control circuit 31 makes C high at time t2 and then makes C low in the period between times t6 and t7 before the transfer end at time t10.

When C is made low in the period between times t6 and t7, the MOS transistor 42 is on during the period, causing voltage Vpgmh to be transferred again to the gate of the MOS transistor 45. This keeps the potential at the gate of the MOS transistor 45 at voltage Vpgmh from time t7 onward, following the period between times t1 and t5. Therefore, the transistor 45 continues transferring voltage Vpgm to the word line. The other times are the same as those explained in the first embodiment.

<Effect of Second Embodiment>

As described above, according to the semiconductor memory device of the second embodiment and the method of controlling the semiconductor memory device, the effect described in item 2, below, will be obtained.

(2) Improvement of Operational Reliability (Part 2)

With the configuration of the second embodiment, the voltage at the gate of the MOS transistor 45 can be prevented from dropping due to, for example, electrical discharge or current leakage. Consequently, it is possible to prevent the MOS transistor 45 from turning off in the middle of transferring voltage Vpgm.

For example, there may be a case where voltage Vpgmh applied to the gate of the MOS transistor 45 is discharged at high speed or the current leaks at high speed. Even in such a case, the MOS transistor 42 turned on periodically in the second embodiment, making the MOS transistor 42 transfer voltage Vpgmh to the gate of the MOS transistor 45, which keeps the potential of the gate at voltage Vpgmh. Accordingly, the MOS transistor 45 can stay on. That is, the MOS transistor 45 continues transferring the voltage Vpgm to the word line WL.

Furthermore, if the discharge of voltage Vpgmh or current leakage at the gate of the MOS transistor 45 is small, use of a local pump enables the gate of the MOS transistor 45 to be kept at voltage Vpgmh. The local pump detects the potential in a certain circuit and, for example, if the absolute magnitude of the voltage has dropped below a preset value, the local pump raises the voltage to a predetermined magnitude. That is, in the second embodiment, the local pump (not shown) is connected to node N3. Then, the local pump detects, for example, Vpgmh at node N3. As a result, even if the potential at node N3 has dropped below the predetermined magnitude, the local pump raises the voltage to Vpgmh, thereby keeping the gate of the MOS transistor 45 at voltage Vpgmh. In this case, the MOS transistor 42 may be off. Depending on the circumstances, not only the effect described in item 2 but also that described in item 1 may be expected.

Third Embodiment

Next, a semiconductor memory device according to a third embodiment of the invention and a method of controlling the semiconductor memory device will be explained. In the third embodiment, the semiconductor memory device will be explained, taking a NAND flash memory as an example as in the first and second embodiments. The third embodiment is such that the rise of voltage Vpgm transferred to the load circuit is controlled in FIG. 2. Hereinafter, only what differs from the first embodiment will be explained.

Since the control circuit 31 and transfer circuit 30 in the word line driver 23 have the same configuration as that shown in FIG. 2, explanation of them will be omitted.

Figure 9:
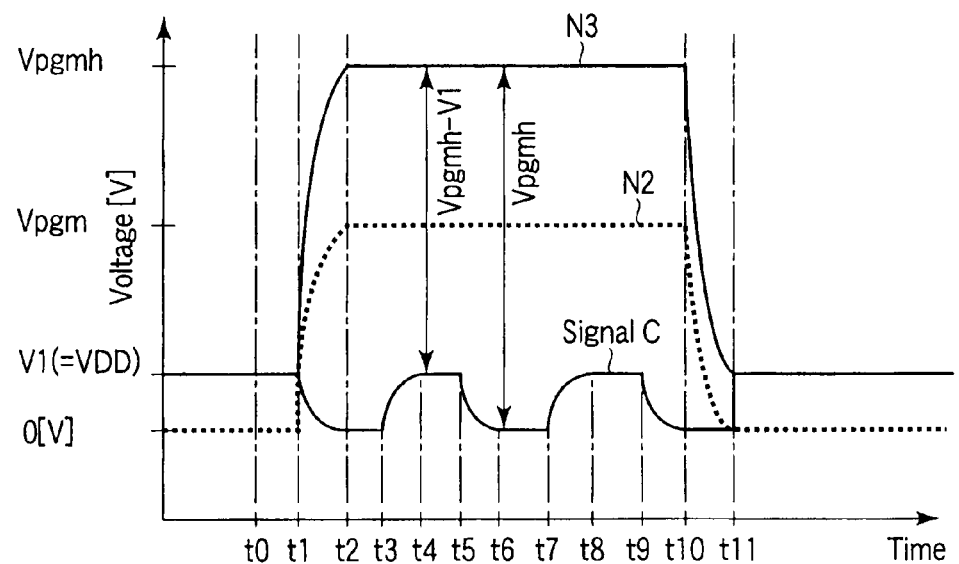

Referring to FIGS. 8 and 9, the voltage transfer operation performed by the word line driver 23 of the third embodiment will be explained. The word line driver 23 operates mainly in two patterns. Hereinafter, two patterns of operation of the word line driver 23 will be explained with reference to FIGS. 8 and 9. To begin with, a first pattern of the voltage transfer operation of the word line driver 23 will be explained with reference to FIG. 8. FIG. 8 is a timing chart to help explain potential changes at nodes N2 and N3 and in signal C, with the ordinate representing voltage and the abscissa representing time. Using C, the word line driver 23 of the third embodiment causes the MOS transistor 42 to turn on and off at short intervals in the period between times t1 and t2.

Specifically, the control circuit 31 applies zero potential and voltage V1 to the gate of the MOS transistor 42 several times as shown in FIG. 8 until the potential at node N3 has reached voltage Vpgmh. This allows the potential at the gate of the MOS transistor 45 to rise gently from time t1 and reach voltage Vpgmh at time t2. As a result, the potential of the word line WL to which the MOS transistor 45 applies a voltage also rises gently from time t1 and reaches voltage Vpgm at time t2. As shown in FIG. 7 of the second embodiment, in the third embodiment, to prevent, for example, electric discharge or current leakage at the gate of the transistor, or node N3, the MOS transistor 42 may be turned on at time t6 and then off again at time t7.

Next, a second pattern of the voltage transfer operation of the word line driver 23 will be explained with reference to FIG. 9. Like FIG. 8, FIG. 9 is a timing chart to help explain potential changes at nodes N2 and N3 and in signal C, with the ordinate representing voltage and the abscissa representing time. In this example, the control circuit 31 is configured to be capable of varying the frequency of C. The control circuit 31 makes the frequency of C higher than that in the first embodiment. That is, the control circuit 31 makes the time constant of C larger than that in the first embodiment. As a result, the rising and falling edges of C become gentle as shown in FIG. 9.

As a result, the potential at the gate of the MOS transistor 45 rises gently from time t1 and reaches voltage Vpgmh at time t2. Following this, the potential of the word line WL also rises gently to voltage Vpgm.

<Effect of Third Embodiment>

As described above, according to the semiconductor memory device of the third embodiment and a method of controlling the semiconductor memory device, the effect described in item 3, below, will be obtained.

(3) Improvement of Operational Reliability (Part 3)

With the configuration of the third embodiment, since voltage Vpgm raises gently, the time lag inherent in the control gate of each of the memory cell transistors MT connected to bit lines BL0 and BLn reaching voltage Vpgm can be made as short as (t2−t1). That is, the time during which stress is applied to the gate insulating film of the memory cell transistor MT connected to bit line BL0 becomes shorter.

By way of comparison, the operation of the word line driver 23 with the time constant of signal C being smaller than that of FIG. 9 will be explained in detail with reference to FIG. 10.

Figure 10:
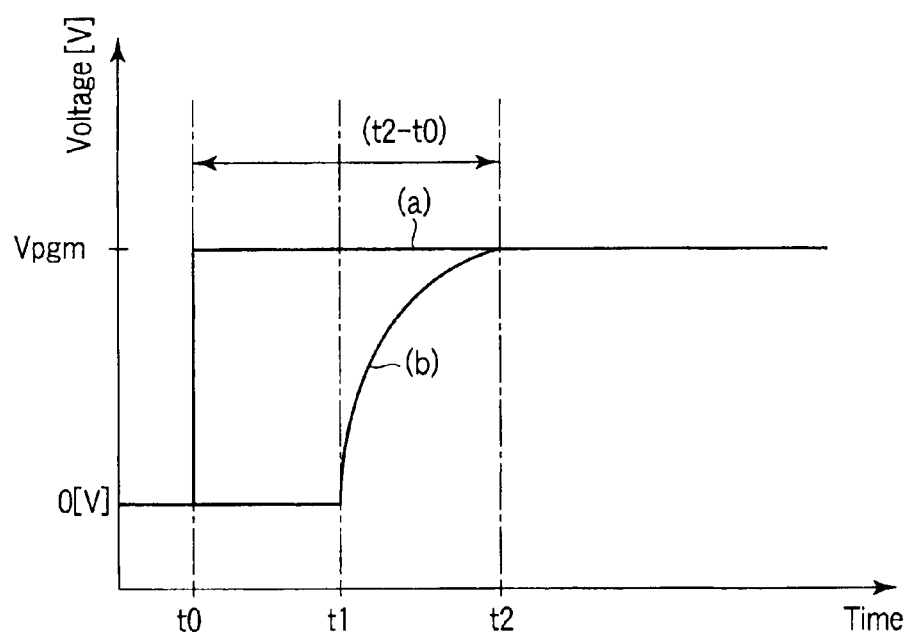
FIG. 10 is a timing chart showing potential changes at the control gate of a memory cell.

FIG. 10 is a timing chart showing a potential change in the control gate of the memory cell transistor MT in transferring voltage Vpgm. In FIG. 10, plot a represents a potential change at the control gate of the memory cell transistor MT connected to bit line BL0 and plot b represents a potential change at the control gate of the memory cell transistor MT connected to bit line BLn. FIG. 10 shows a case where the MOS transistor 45 is turned on at time t0.

As shown by plot a, the potential at the control gate of the memory cell transistor MT connected to bit line BL0 reaches voltage Vpgm almost at time t0. As shown by plot b, the potential at the control gate of the memory cell transistor MT connected to bit line BLn starts to rise at time t1 with a delay of, for example, (t1−t0) and reaches voltage Vpgm at, for example, time t2. That is, there is a time lag of (t2−t0) between the time at which the control gate of the memory cell transistor MT connected to bit line BL0 reaches voltage Vpgm and that at which the control gate of the memory cell transistor MT connected to bit line BLn reaches voltage Vpgm. Two causes of the time lag are possible. Hereinafter, the causes will be described. The first cause is the distance from the row decoder 2 of the memory cell transistor MT. As shown in FIG. 1, the distance from the row decoder 2 to the memory cell transistor MT connected to bit line BLn is greater than the distance from the row decoder 2 to the memory cell transistor MT connected to bit line BL0. Accordingly, there is a difference in the time required for voltage Vpgm transferred to the word line WL to be transferred to the memory cell transistor MT connected to bit line BLn. This corresponds to the difference between time t0 and time 51 in FIG. 10.

The second cause is an RC delay due to the resistive component R of the word line WL and the line capacitance C between adjacent word lines WL (n=0 to 15) in the memory cell array 1. The RC delay caused by the resistive component R between the row decoder 2 and the memory cell transistor MT connected to bit line BLn and the line capacitance C is larger than the RC delay caused by the resistive component R between the row decoder 2 and the memory cell transistor MT connected to bit line BL0 and the line capacitance C. The reason is that the resistive component R between the row decoder 2 and the memory cell transistor MT connected to bit line BLn and the line capacitance C are greater than that between the row decoder 2 and the memory cell transistor MT connected to bit line BL0 and the line capacitance C. Accordingly, as shown by plot b in FIG. 10, the rise of voltage Vpgm applied to the gate of the memory cell transistor MT connected to bit line BLn gets slower. That is, as shown in FIG. 10, plot b rises more gently than plot a in the period between times t1 and t2.

Accordingly, the period during which voltage Vpgm is applied between the gate and channel of the memory cell transistor MT connected to bit line BL0 is longer than that of the memory cell transistor MT connected to bit line BLn. Consequently, more stress is applied to the memory cell transistor MT connected to bit line BL0, with the result that the memory cell transistor MT is more liable to deteriorate. This is a serious problem from the viewpoint of the operational reliability of the memory cell transistor MT. Here, as seen from FIG. 10, the expression (t2−t0)>(t2−t1) is satisfied.

The above problem can be overcome with the configuration of the third embodiment.

Hereinafter, explanation will be given with reference to FIG. 11. FIG. 11 is a timing chart to help explain potential changes at the control gate of a memory cell transistor of the third embodiment, with the ordinate representing voltage and the abscissa representing time. In FIG. 11, plot a represents a potential change at the control gate of the memory cell transistor MT connected to bit line BL0 and plot b represents a potential change at the control gate of the memory cell transistor MT connected to bit line BLn.

As shown by plot a, the potential at the control gate of the memory cell transistor MT connected to bit line BL0 starts to rise at time t0 and reaches voltage Vpgm at, for example, time t1. As shown by plot b, the potential at the control gate of the memory cell transistor MT connected to bit line BLn starts to rise at time t1 with a delay of, for example, (t1−t0) and reaches voltage Vpgm at, for example, t2.

That is, the time difference between the timing with which voltage Vpgm is applied to the gate insulating film of the memory cell transistor MT connected to bit line BL0 and the timing with which voltage Vpgm is applied to the gate insulating film of the memory cell transistor MT connected to bit line BLn is (t1−t0) shorter than that in FIG. 10.

That is, making the rise of the transferred voltage Vpgm gentler makes it possible to shorten the time during which voltage Vpgm is applied to the gate insulating film of the memory cell transistor MT connected to bit line BL0. Consequently, the time during which stress is applied to the gate insulating film connected to bit line BL0 becomes shorter, which enables the operational reliability to be improved. Depending on the circumstances, not only the effect described in item 3 but also any combination of the effects described in items 1, 2 and 3 may be expected.

Fourth Embodiment

Next, a semiconductor memory device according to a fourth embodiment of the invention and a method of controlling the semiconductor memory device will be explained. The fourth embodiment relates to a word line driver 23 corresponding to an unselected word line in writing data into a NAND flash memory according to each of the first to fourth embodiments.

The word line driver 23 corresponding to an unselected word line is such that the voltage the transfer circuit 30 transfers to a word line WL is changed from voltage Vpgm to voltage Vpass. Voltage Vpass is a voltage that turns on a memory cell transistor MT, regardless of the data held in the memory cell transistor MT.

Hereinafter, the write operation of a NAND flash memory according to the fourth embodiment will be described briefly, using a case where word line WL0 in FIG. 1 is used as the selected word line. In writing data, write data is transferred to a bit line BL. Specifically, when the threshold potential of a memory cell transistor MT is raised by injecting electrons into the charge storage layer, a write voltage (zero) is applied to the bit line BL. When no electrons are injected, a write inhibit voltage (e.g., VDD) is applied.

Then, the word line driver 23 corresponding to the selected word line WL0 transfers Vpgm to the selected word line WL0 as explained in the first to third embodiments. The word line drivers 23 corresponding to the unselected word lines WL1 to WL15 transfer voltage Vpass to the unselected word lines WL1 to WL15.

As a result, the memory cell transistors MT connected to the unselected word lines WL0 to WL15 turn on, forming channels. That is, a current path is formed in the NAND cell 11 and becomes conductive. Select transistor ST1 turns on or cuts off, depending on the write data. Select transistor ST2 is off.

For example, when a write voltage is applied to the bit line BL, select transistor ST1 turns on, causing the write voltage to be transferred to the channel of the memory cell transistor MT. Then, in the memory cell transistor MT connected to the selected word line WL0, the potential difference between its gate and channel becomes almost voltage Vpgm, causing charge to be injected into the charge storage layer. As a result, the threshold voltage of the memory cell transistor MT rises.

When the write inhibit voltage is applied to bit line BL0, select transistor ST1 cuts off. Accordingly, the channel of the memory cell transistor MT in the NAND cell 11 electrically floats. Then, the channel potential of the memory cell transistor MT rises through the coupling with the gate potential (voltage Vpgm and voltage Vpass). Since the potential difference between the gate and channel of the memory cell transistor MT connected to the selected word line WL0 is insufficient, charge is not injected into the charge storage layer (to the extent that the held data is varied). As a result, the threshold value of the memory cell transistor MT remains unchanged.

In this way, the data write operation is executed.

As described above, even when voltage Vpass lower than voltage Vpgm is used, a semiconductor memory device including a NAND flash memory according to the first to third embodiments and a method of controlling the semiconductor memory device can be applied. Consequently, any combination of the effects described in items 1 to 3 may be expected.

Fifth Embodiment

Next, a semiconductor memory device according to a fifth embodiment of the invention and a method of controlling the semiconductor memory device will be explained. The fifth embodiment relates to the read operation of a word line driver 23 in a NAND flash memory according to the first to fourth embodiments. Hereinafter, only the operation of the word line driver 23 will be explained.

The configuration of the word line driver 23 is the same as that of FIG. 2 explained in the first embodiment. The basic operation of the word line driver 23 is the same as in FIG. 5 explained in the first embodiment, in FIG. 7 explained in the second embodiment, or in FIG. 8 or 9 explained in the third embodiment, except that, in a read operation, voltage Vreadh is applied to node N4 of the word line driver 23. In addition, the word line driver 23 corresponding to the selected word line transfers voltage Vcgr to the selected word line WL. That is, voltage Vcgr is applied to the source of the MOS transistor 45. The word line drivers 23 corresponding to the unselected word lines transfer voltage Vread to the unselected word lines WL. That is, voltage Vread is applied to the source of the MOS transistor 45.

Voltage Vread is a voltage that turns on a memory cell transistor MT, regardless of the data in the memory cell transistor MT. Voltage Vcgr is varied according to the data to be read. Voltage Vreadh, which is higher than voltage Vread, is a voltage that turns on the MOStransistor 45 to transfer Vread to the unselected word line. Accordingly, voltage Vreadh is higher than voltageVread.

Then, the word line driver 23 corresponding to the selected word line WL0 transfers voltage Vcgr to the selected word line WL0. The word line drivers 23 corresponding to the unselected word lines WL1 to WL15 transfer voltage Vread to the unselected word lines WL1 to WL15.

Then, if the memory cell transistor MT connected to the selected word line WL0 goes into the on state, the bit line BL and source line SL go into the conductive state. That is, current flows from the bit line BL to the source line SL. If the memory cell transistor MT is in the off state, the bit line BL and source line SL go into the nonconductive state. That is, no current flows from the bit line BL to the source line SL. By the above operation, the data are read from all of the bit lines at the same time.

<Effects of Fifth Embodiment>

With the semiconductor memory device of the fifth embodiment and the method of controlling the semiconductor memory device, the period during which a potential difference of Vreadh develops in the gate insulating film of the MOS transistor 42 can be shortened in a read operation. Moreover, any combination of the effects described in items 1 to 3 in the first to third embodiments may be expected.

Specifically, even when voltage Vreadh is lower than voltage Vpgmh, applying a voltage to the gate insulating film of the MOS transistor 42 for a long time puts stress on the MOS transistor 42. With the configuration of the fifth embodiment, however, stress on the MOS transistor 42 can be reduced by turning off the MOS transistor 42 for part of the period during which voltage Vcgr and voltage Vread are being transferred.

When the MOS transistor 42 turns on, causing voltage Vpgmh to be transferred via node N3, signal BSTON changes voltage VDD to zero, turning off the MOS transistors 43 and 44.

<Modification>

The word line driver 23 may have a configuration as shown in FIG. 12. FIG. 12 is a circuit diagram of the word line driver 23. As shown in FIG. 12, the word line driver 23 includes a delay circuit 50 and an AND gate 51. Specifically, the delay circuit 50 is provided between node N1 and the inverter 48. A signal at node N1 and signal B supplied to the OR gate 46 are input to the AND gate 51, which produces the logical product of the two signals, outputting the result as BSTON. The remaining configuration is unmodified, so explanation will be omitted.

Figure 13:
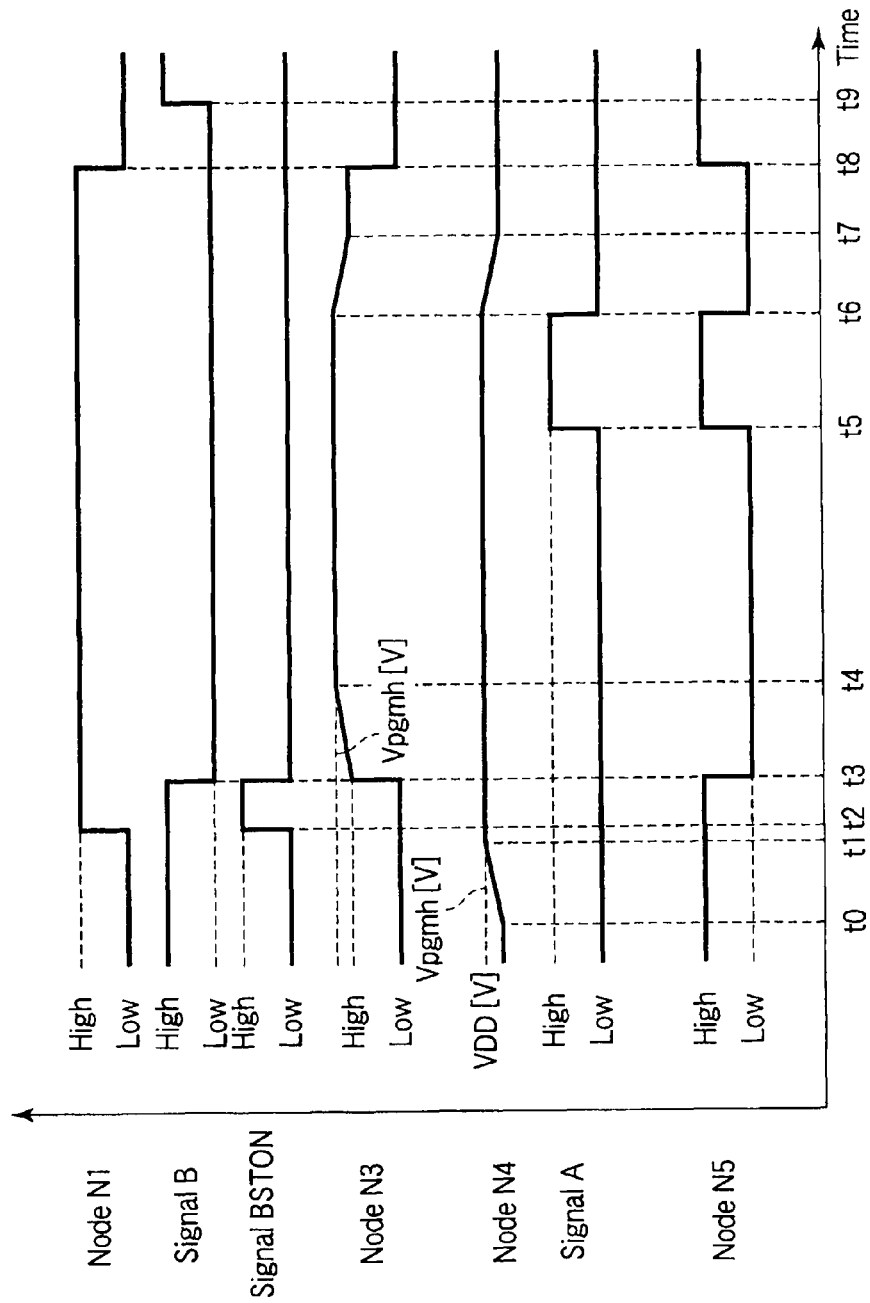
FIG. 13 is a timing chart of potential changes at nodes N1, N3, N4, and N5, and in signals BSTON, A, and B, illustrating the voltage transfer operation by a word-line driver according to a modification of the first embodiment.

Next, FIG. 13 is a timing chart of various signals in the word line driver 23 of FIG. 12. FIG. 13 is a timing chart for node N1, signal B, signal BSTON, node N3, node N4, signal A, and node N5. As in the first embodiment, the timing with which signals A and B are supplied is controlled by the control unit 3.

As shown in FIG. 13, the potential at node N4 starts to rise from voltage VDD at time t0 and reaches voltage Vpgmh at time t1. At this time, B and node N5 are made high. Thereafter, at time t2, node N1 is changed from low to high. This makes BSTON high. Then, the delay circuit 50 keeps B high until time t3 is reached. That is, BSTON also stays high until time t3 is reached. This turns transistors 43 and 44 on in the period between times t2 and t3, causing a potential corresponding to the high at node N1 to be transferred to node N3. After time t3 has been reached, BSTON is made low, that is, zero potential.

Since at time t3, node N5 is made low, transistor 42 is turned on. This causes voltage Vpgmh at node N4 to be transferred to node N3. Then, at time t4, the potential at node N3 is made Vgrmh. Explanation of those parts also found in the first embodiment has been omitted.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method of controlling a semiconductor memory device which includes a transfer circuit which includes a p-type MOS transistor with a source to which is applied a first voltage and an n-type MOS (metal-oxide-semiconductor) transistor to whose gate a drain of the p-type MOS transistor is connected and the first voltage is transferred, to whose source a second voltage is applied, and whose drain is connected to a load, and a control circuit which turns the p-type MOS transistor on and off, the method comprising:
- making the control circuit turn the p-type MOS transistor on to make the p-type MOS transistor transfer the first voltage to the gate of the n-type MOS transistor, thereby turning the n-type MOS transistor on;
- turning the n-type MOS transistor on to transfer the second voltage to the load;
- turning the p-type MOS transistor off in the middle of transferring the second voltage to the load, thereby making the gate of the n-type MOS transistor float at the first voltage; and
- making the n-type MOS transistor, being in a floating state, transfer the second voltage to the load.

2. The method according to claim 1, wherein the control circuit turns the p-type MOS transistor on at least once by the time the n-type MOS transistor has completed transferring the second voltage.

3. The method according to claim 1, wherein the control circuit includes a logic circuit which carries out an operation using a first signal and a second signal and, on the basis of the result of the operation, causes a gate of the p-type MOS transistor to turn on and off.

4. The method according to claim 3, wherein a rise of the second voltage is controlled by varying the frequency of a third voltage according to the result of the operation.

5. The method according to claim 3, wherein the logic circuit is an OR gate.

* * * * *